United States Patent
Kim et al.

(10) Patent No.: US 9,799,401 B2
(45) Date of Patent: Oct. 24, 2017

(54) INCREMENTAL STEP PULSE PROGRAMMING

(71) Applicant: Seagate Technology LLC, Cupertino, CA (US)

(72) Inventors: Gyu-Chul Kim, Lakeville, MN (US); Youngpil Kim, Eden Prairie, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/487,769

(22) Filed: Sep. 16, 2014

(65) Prior Publication Data

US 2016/0078945 A1    Mar. 17, 2016

(51) Int. Cl.
| | | |
|---|---|---|
| *G11C 11/34* | (2006.01) | |
| *G11C 16/04* | (2006.01) | |
| *G11C 16/10* | (2006.01) | |
| *G11C 16/12* | (2006.01) | |
| *G11C 16/34* | (2006.01) | |

(52) U.S. Cl.
CPC .......... *G11C 16/10* (2013.01); *G11C 16/0483* (2013.01); *G11C 16/12* (2013.01); *G11C 16/349* (2013.01)

(58) Field of Classification Search
CPC ............ G11C 16/3418; G11C 11/5628; G11C 16/0483; G11C 16/10; G11C 16/3427; G11C 16/06; G11C 16/349; G11C 16/3495; G11C 16/12
USPC ............. 365/185.03, 185.11, 185.17, 185.19
See application file for complete search history.

(56) References Cited

U.S. PATENT DOCUMENTS

| 7,349,263 B2 | 3/2008 | Kim et al. | |
|---|---|---|---|
| 7,548,457 B2 | 6/2009 | Kang et al. | |
| 7,564,714 B2 | 7/2009 | Kang et al. | |
| 8,879,319 B1* | 11/2014 | Cassuto | G11C 16/10 365/185.03 |
| 2007/0253249 A1* | 11/2007 | Kang | G11C 11/5628 365/185.03 |
| 2009/0067247 A1* | 3/2009 | Park | G11C 16/0483 365/185.17 |
| 2009/0257280 A1* | 10/2009 | Oh | G11C 16/10 365/185.19 |
| 2012/0224430 A1* | 9/2012 | Visconti | G11C 16/10 365/185.19 |
| 2012/0239858 A1* | 9/2012 | Melik-Martirosian | G06F 11/076 711/103 |

(Continued)

OTHER PUBLICATIONS

Suh et al., "A 3.3V 32Mb NAND Flash Memory with Incremental Step Pulse Programming Scheme," 1995 IEEE International Solid State Circuits Conference, 3 pages.*

(Continued)

*Primary Examiner* — Kretelia Graham
(74) *Attorney, Agent, or Firm* — Holzer Patel Drennan

(57) ABSTRACT

The disclosed technology provides enables incremental step pulse programming (ISPP) operations with variable pulse step height control. In particular, a storage device is configured to select a pulse step height for an ISPP operation of one or more memory cells of a storage device based on a write frequency of data programmed via the ISPP operation. The storage device saves the data by applying a series of electrical pulses to the one or more memory cells, each subsequent pulse increasing in magnitude by the selected pulse step height.

15 Claims, 4 Drawing Sheets

(56) References Cited

U.S. PATENT DOCUMENTS

| | | | |
|---|---|---|---|
| 2012/0239991 A1* | 9/2012 | Melik-Martirosian | G06F 11/3034 714/708 |
| 2013/0176784 A1* | 7/2013 | Cometti | G11C 16/10 365/185.11 |
| 2014/0226412 A1* | 8/2014 | Yeh | G11C 11/5628 365/185.21 |
| 2014/0372674 A1* | 12/2014 | Kim | G06F 12/0246 711/103 |
| 2015/0131373 A1* | 5/2015 | Alhussien | G11C 16/3431 365/185.02 |
| 2015/0235705 A1* | 8/2015 | Cai | G11C 16/10 365/185.24 |
| 2016/0011971 A1* | 1/2016 | Lee | G06F 12/0246 711/103 |

OTHER PUBLICATIONS

Inoue et al., "NAND Flash Applications Design Guide," Apr. 2003, Toshiba, Rev.1, 29 pages.*

Kim et al., "Verify level control criteria for multi-level cell flash memories and their applications", EURASIP Journal on Advances in Signal Processing 2012-196, 2012, http://asp.eurasipjournals.com/content/2012196, 13 pages.

* cited by examiner

INCREMENTAL STEP PULSE PROGRAMMING

BACKGROUND

Flash memory devices are a type of nonvolatile semiconductor memory device that store data values as threshold voltages in number of memory cells. In general, flash memory devices perform programming operations, erase operations, and read operations. A programming operation is carried out by applying a word line bias voltage to word lines to which memory cells of a selected page are connected. Incremental Step Pulse Programming (ISPP) is one programming scheme useful in maintaining a tight cell threshold voltage distribution for higher data reliability. In ISPP, a series of programming pulses of increasing magnitude are applied to select memory cells to gradually raise the threshold voltage of the memory cells to above a threshold level.

SUMMARY

Implementations described and claimed herein provide for a storage controller configured to select a pulse step height for an incremental step pulse programming (ISPP) operation of one or more memory cells of a storage device based on a write frequency of data programmed via the ISPP operation. The storage device saves the data by applying a series of electrical pulses to the one or more memory cells, each subsequent electrical pulse increasing in magnitude by the selected pulse step height.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

DETAILED DESCRIPTION

Figure 1:
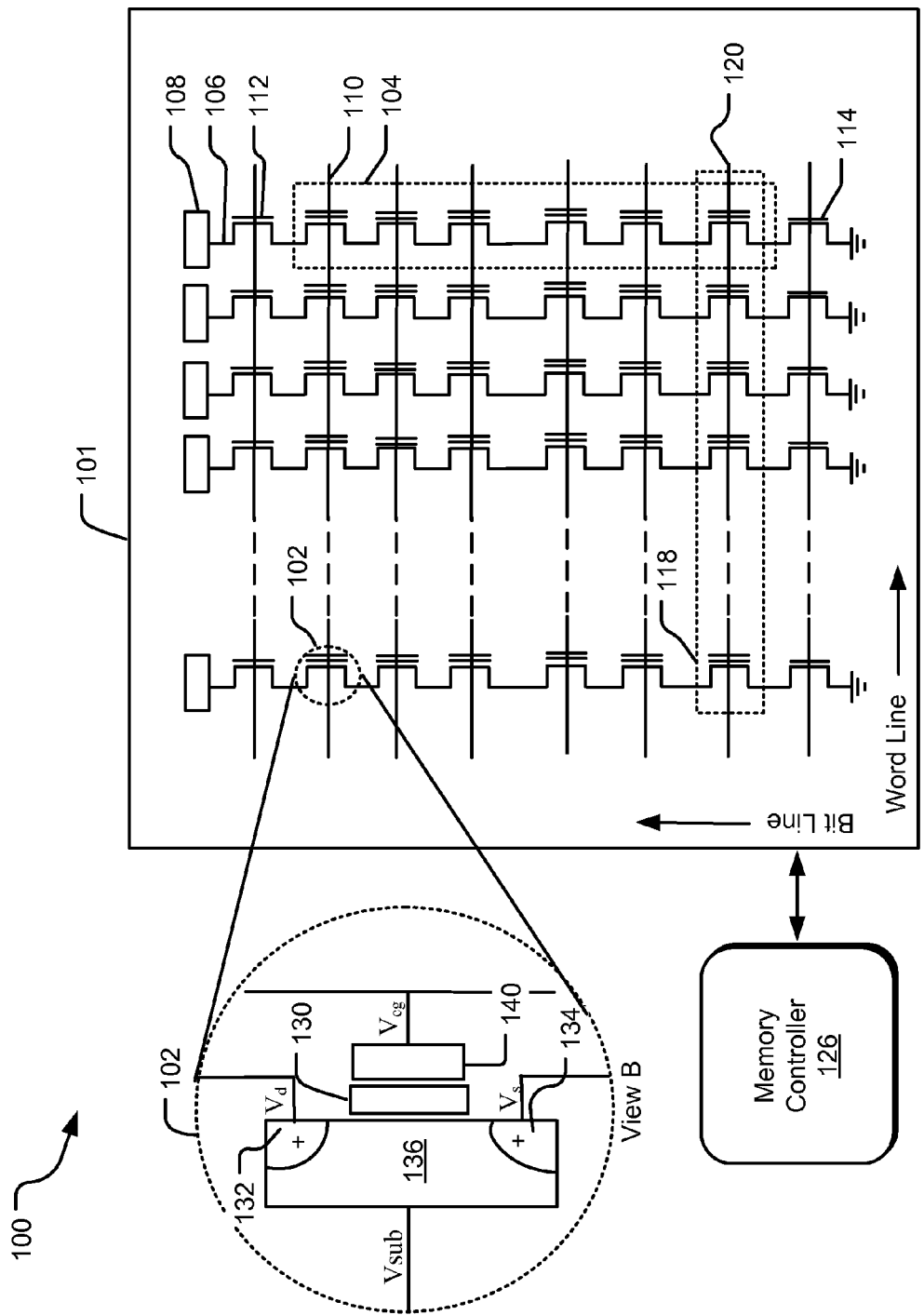
FIG. 1 illustrates an example memory array suitable for implementing aspects of the disclosed technology.

FIG. 1 illustrates an example memory device 100 suitable for implementing aspects of the disclosed technology. The memory device 100 includes a memory controller 126 that stores and retrieves data from a memory array 101 of the memory device 100. The memory controller 126 communicates with a host (not shown) to accept data for storage in the memory array 101 and for outputting data retrieved from the memory array 101. The memory array 101 comprises multiple analog memory cells (e.g., a memory cell 102) that each hold a continuous, analog value such as an electrical voltage or charge that depends on a number of electrons trapped within a region of the cell.

In various implementations, memory array 101 may comprise a number of different types of analog memory cells, such as, for example, NAND, NOR, MRAM, ferroelectric RAM, magnetic RAM, spin-torque transfer RAM, resistive RAM, phase change memory, etc. In FIG. 1, the illustrated memory array 101 is a NAND flash memory array. The memory array 101 may be an individual memory array, or a three-dimensional stack of memory arrays, such as 3D NAND Flash Memory, 3D NOR Flash Memory, etc.

In one implementation, the memory array 101 includes a plurality of floating-gate transistor memory cells (e.g., the memory cell 102 connected in series, in what are generally referred to as NAND strings (e.g., a string 104)). Each NAND string is coupled to a bitline (e.g., a bitline 106 from which data can be read via an output bus (e.g., bus 108)). The cells of adjacent strings are coupled via word lines (e.g., word line 110) that select which row of memory cells is affected by reading and programming operations. Select transistors 112 (e.g., a source select transistor), 114 (e.g., a ground select transistor) also selectively couple column selection circuits and ground to activate select columns during reading and program operations. Generally, each word line may be associated with one or more pages (e.g., page(s) 118), which are the smallest physically addressable data units for programming and reading operations. The size of the page in bits (which may include both user data and error correction codes, or ECC) corresponds to the number of NAND strings in the word line.

A flash memory cell retains an electrical state by charging a floating gate to a particular voltage. This results in a predefined amount of current flowing through the channel when a specified read voltage is applied. Referring to detailed View B of the memory cell 102, the memory cell 102 includes a source region 134 and a drain region 132 located at a surface of a substrate 136. A gate structure is aligned over a channel region defined between the source region 134 and the drain region 132. The gate structure includes a floating gate 130 and a control gate 140. Although not shown, a tunneling dielectric layer is, in one implementation, interposed between the floating gate 130 and the surface of the substrate 136, and another thin oxide layer or control dielectric is interposed between the floating gate 130 and the control gate 140. In the illustrated example, the drain voltage $V_d$ is supplied from a bit line and the control gate voltage $V_{cg}$ is supplied from a word line, and the source voltage $V_s$ is connected to a reference potential such as ground.

In order to change (program) the memory cell 102 from an initial state to a programmed state, a process known as Fowler-Nordheim (FN) tunneling is utilized. Briefly, a relatively large positive potential difference is created between the control gate 140 and the substrate 136, and excited electrons within the channel on the surface of the substrate are caused to be pushed through and trapped in the floating gate 130. These negatively charged electrons act as a barrier between the control gate 140 and channel on the substrate 136, increasing the threshold voltage of the memory cell transistor. The memory cell 102 can be brought back to its initial state by forming a large negative potential difference between the control gate 140 and the substrate 136, which draws electrons back across the thin oxide layer between the floating gate 130 and the substrate 136, thus removing the electron barrier and decreasing the threshold voltage of the memory cell 102.

The memory device 100 stores data in the analog memory cells of the memory array 101 by programming the cells to assume respective memory states. The memory states are selected from a finite set of possible levels, and each level corresponds to a certain nominal storage value. In a single level cell (SLC) storage device, each memory cell transistor stores a voltage that corresponds to one of two possible memory states ('0' or '1'). For example, the memory state '0' may correspond to a first range of voltages and the memory state '1' may correspond to a second range of voltages.

In a multi-level cell (MLC) storage device, each memory cell stores two or more bits of data and the memory cell can be programmed to assume a range of possible nominal storage values. If, for example, each memory cell transistor stores two bits of data, then the memory cell may be programmed to assume one of three possible programming levels from an erased state by writing one of three possible nominal storage values to the cell. A fourth nominal storage value is used for the erased state.

Incremental step pulse programming (ISPP) is one approach for programming memory states in MLC and SLC transistors. In an ISPP operation, a program voltage is applied to the control gate of a selected memory cell using short successive program pulses of increasing magnitude. If, for example, a page 118 is selected for a programming operation, a bias voltage is applied to word lines (in this case, word line 120) to which the memory cells of the page 118 are connected. The ISPP programming method programs the selected page 118 several times while gradually increasing a word line bias voltage on a step-voltage basis. The magnitude of this "step" (e.g., the increase in magnitude of each pulse relative to the immediately previous pulse) is herein referred to as the "pulse step height."

Between each pulse of increased magnitude, a program verify operation is performed to check whether each of the selected memory cell has a threshold voltage that has risen above a program verify voltage level for that memory cell. The ISPP operation continues until the threshold voltage of each of the selected memory cells (e.g., the memory cells of the page 118) rises above the corresponding program verify voltage so that the threshold voltage of each of the cells represents a desired memory state.

By nature, cell voltages in each different programmed state of the memory device 100 can be plotted as a Gaussian-like distribution. Over time, electrons injected into the floating gate of a memory cell may dissipate, causing a change in the memory cell's threshold voltage. For this reason, the voltage distributions of the programmed states are prone to widening over time. If enough electrons dissipate within an individual memory cell, it can become difficult to decipher the programmed state of the cell. As the distribution widens, the voltages of cells in one distribution may approach and/or overlap with voltages of cells of an adjacent distribution. In such case, it can become difficult to decipher the programmed state of the cells.

Despite this electron dissipation, long-term data retention statistics of flash memory can be improved by altering the pulse step height used in ISPP programming. For example, memory cells may exhibit more robust data retention characteristics when the pulse step height used in ISPP programming is small, tightening the threshold voltage distribution for a state. However, small pulse step heights also increase program time. Therefore, a tradeoff exists between data retention characteristics and write speed.

According to one implementation of the disclosed technology, a pulse step height is selected for an ISPP programming operation of a memory cell depending upon a write frequency of the data that is being written to the memory cell. As used herein, "write frequency" of data refers to a frequency with which the data of a programming operation is re-written (e.g., overwritten, moved, etc.) within memory of a flash device. For example, a word document may consume two blocks and fifty pages of memory in a flash devise. Updating the document entails erasing and changing the programmed states of some or all of the blocks and pages. However, erasure operations are, in some circumstances, performed on a block basis, and not a page basis. As a result, many programming operations entail moving the data between different blocks and pages of the memory device.

Data associated with a write frequency exceeding a set threshold may be referred to as "hot data," while data associated with a write frequency below a set threshold may be referred to as "cold data." The threshold separating hot data from cold data varies in different implementations. In one implementation, hot data refers to data that is updated every few hours or days, while cold data refers to data that stays intact for a much longer period of time such as a month, several months, or even years. This may be the case, for example, in a data center for telecommunications or storage systems. In at least one implementation, the terms "hot data" and "cold data" refer to a read frequency of data instead of (or in addition to) a write frequency of data.

In one implementation of the disclosed technology, a small pulse step height is selected for an ISPP programming operation of cold data to a memory cell. For example, the data may be identified as "cold" because it has not been re-written (e.g., moved, changed, etc.) in more than one month. An example pulse step height that may be suitable for a programming operation of cold data is 0.35-0.45 V. Because colder data is data that is, by definition, not touched for an extended period of time, cold data is more susceptible to corruption due to changes in the charge of memory cells that occur naturally over time. Using a smaller pulse step height may help mitigate this data loss.

In another implementation of the disclosed technology, a large pulse step height is selected for an ISPP programming operation of hot data to a memory cell. For example, the data may be identified as "hot" because it has been re-written several times in the past day or week. An example pulse step height that may be suitable for a programming operation of cold data is 0.5-2V. By using a larger pulse step heights for programming operations for hot data, total program times are decreased in a storage device including the memory device 100. In some implementations of the disclosed technology, an ISPP voltage pulse step height may assume one of multiple (e.g., three or more) values based on the write frequency of associated data. For example, data may be ranked not only as "hot" and "cold," but also as "warm," "cool," and a range of values in between.

Figure 2:
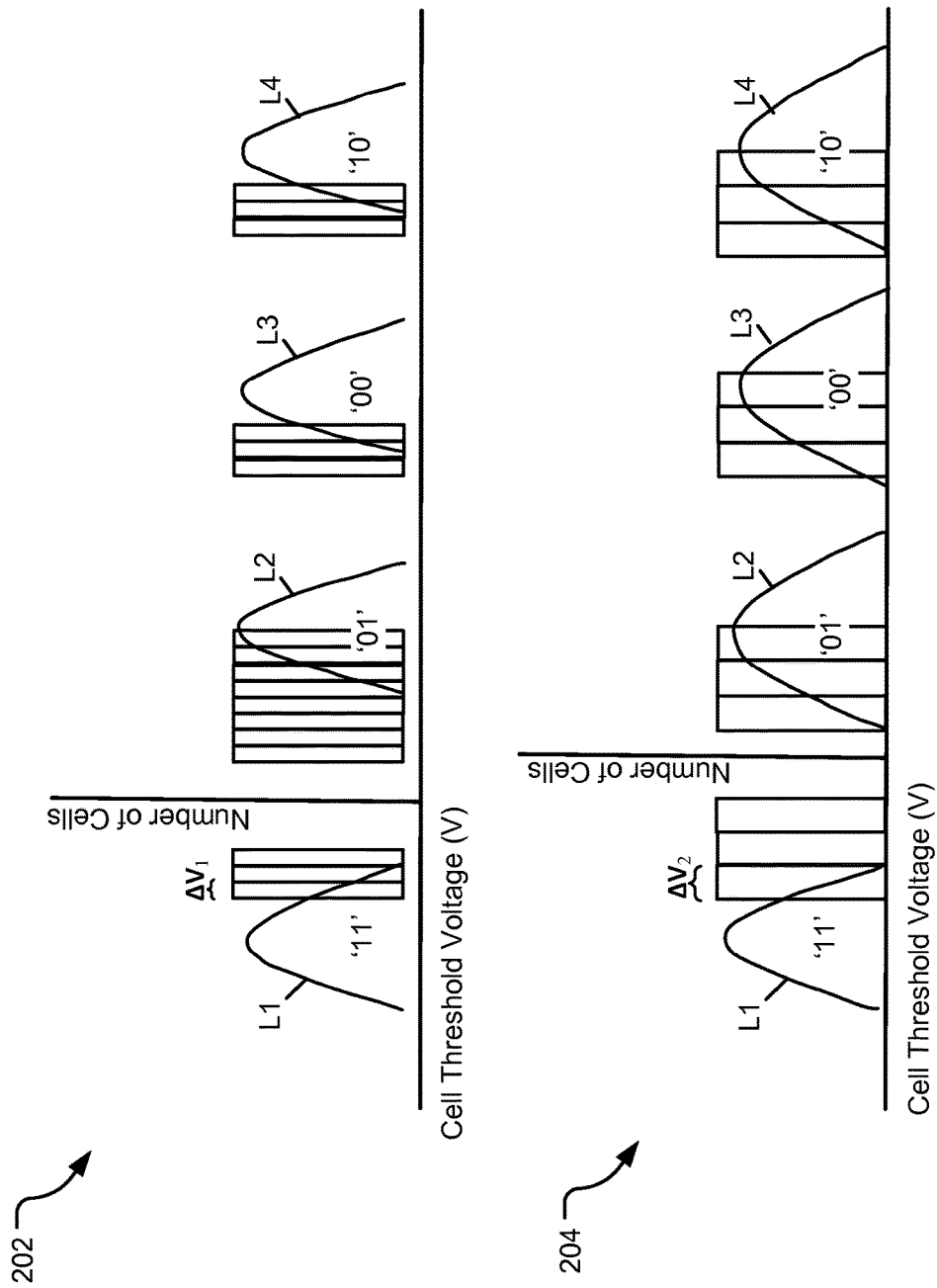
FIG. 2 illustrates plots and illustrating example threshold voltage distributions resulting from incremental step pulse programming (ISPP) operations using variable pulse step heights.

FIG. 2 illustrates plots 202 and 204 illustrating example memory cell threshold voltage distributions resulting from ISPP operations using variable pulse step heights (e.g., pulse step heights $\Delta V_1$ and $\Delta V_2$). The different voltage distributions are each associated with a different nominal storage state level (e.g., L1, L2, L3, and L4). Due to random variations in device characteristics, the threshold voltages exhibit bell curve distributions.

Any memory cell having a voltage that falls within one of the nominal storage state levels (e.g., L1, L2, L3, and L4) is assigned a corresponding memory state. In FIG. 2, each memory state is a two-bit logic value. For example, memory cells storing a voltage in the range L1 are assigned a memory state '11'; memory cells storing a voltage in the range L2 are assigned a memory state '01'; memory cells storing a voltage in the range L3 are assigned a memory state '00'; and memory cells storing a voltage in the range L4 are assigned a memory state '10.' In other implementations, memory states may be a single-bit values or multi-bit values of three or more bits. In the example of FIG. 2A, a memory cell is said to be 'programmed' when its threshold voltage is increased from an erased state (memory state '11') to one of the threshold voltages of a higher state. Thus, the threshold voltage distribution to the far left of the diagram ('11') is the erased state.

During an ISPP operation, a sequence of program pulses are applied to the control gate of a selected memory cell to gradually raise the voltage of that memory cell to the next adjacent memory state. Each subsequent program pulse increases in magnitude by a pulse step height (e.g., pulse step heights $\Delta V_1$ and $\Delta V_2$) relative to the prior pulse. For example, pulses increasing in magnitude by 0.1V relative to the previous pulse are applied to gradually raise a memory cell transistor voltage from a L1 programmed state level to an L2 programmed state level.

As discussed with respect to FIG. 1, the electrons injected into the memory cells can dissipate over time. Thus, memory cells storing cold data exhibit voltage distributions that tend to widen and shift to the left over time (toward the erased state). Consequently, it can become increasingly difficult with time to decipher the memory state of each cell storing cold data.

When a smaller pulse step height ($\Delta V_1$) is used (as illustrated by the plot 202), the memory cells exhibit resulting voltage distributions that are narrower in width than of distributions observed when a larger pulse step size ($\Delta V_2$) is used (as illustrated by the plot 204). Therefore, smaller pulse step heights can be useful in mitigating data loss, particularly with respect to memory cells storing cold data that is especially vulnerable to corruption because it is not likely to be re-written for an extended period of time.

Figure 3:
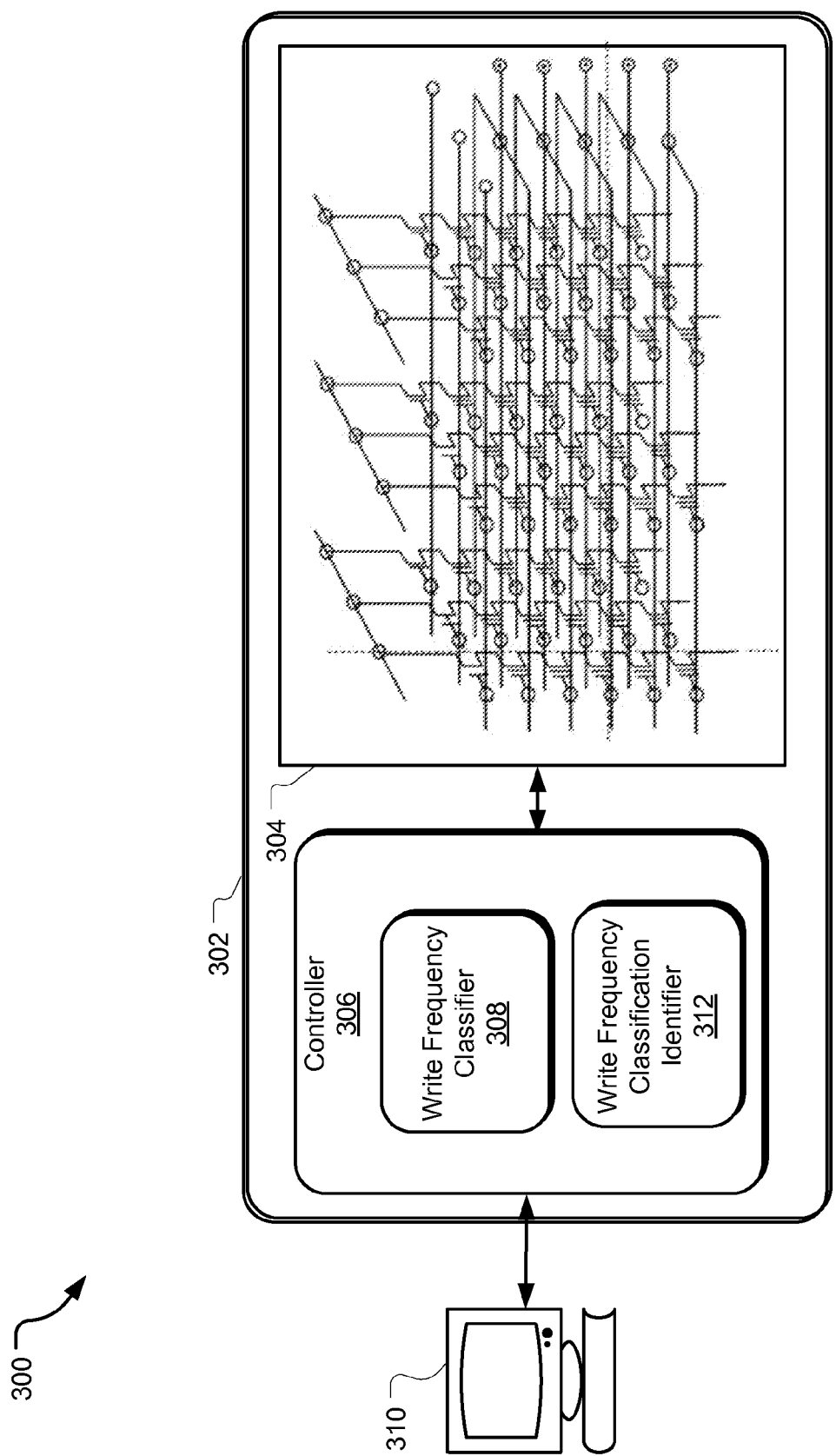
FIG. 3 illustrates an example system for performing a programming operation based on the write frequency of associated data.

FIG. 3 illustrates an example system 300 for performing a programming operation based on the write frequency of associated data. The system 300 includes a storage device 302 with one or more memory blocks (e.g., memory block 304). In one implementation, the memory block 304 represents 512 bytes of data and 32 individual pages. Data is programmed to the memory block 304 by a controller 306. The controller 306 communicates with a host 310 to accept data for storage in the memory block 304. The controller 306 further includes a write frequency classifier 308 that classifies the incoming data according to a frequency with which that data is expected to be accessed.

For example, the write frequency classifier 308 may determine whether the data is "hot" (likely to be accessed frequently) or "cold" (likely to be accessed infrequently) based on one or more attributes of the data, or based on supplemental information supplied by the host 310. In one implementation, the write frequency classifier 308 classifies the write frequency of the data based on a target location to which the incoming data is addressed. For example, data addressed to a region associated with user documents may be classified as hot while data addressed to a region associated with a downloads folder may be classified as cold. In another implementation, it is the host 310 rather than the write frequency classifier 308 that classifies the write frequency of the data. For example, the host 310 may run one or more modules that monitor user activity and rank the write frequency of various files according to user actions, such as placement of a media file on a "favorites" playlist or based on the type of program that is used to view a particular file.

In still other implementations, the write frequency of data is classified based on whether or not the initial write of the data to the storage device 302 is initiated by a user or a background data monitoring process. The host 310 may, for example, supply the controller 306 with suitable information to determine whether a particular programming operation is user-initiated.

In another implementation, the host 310 or the write frequency classifier 308 classifies the write frequency of the data on a sliding scale of possible values. For example, the write frequency classifier 308 may rank the expected write frequency of the data between 1 and 10, where a '10' indicates that the data is likely to be accessed very frequently (e.g., every day) and a '1' indicates that the data is likely to be accessed very infrequently (e.g., once per year).

The write frequency classifier 308 (or the host 310) assigns a write frequency classification to the classified data, and the controller 306 saves the write frequency classification in association with the data on the memory block 304. For example, the write frequency classification may be saved in a same memory block or page as corresponding data. In one implementation, the controller 306 saves the write frequency classification of data as a single-bit flag indicating whether associated data in the same page or data block is hot or cold. A single-bit flag may be saved, for example, in each page of the new incoming data. Alternatively, a single-bit flag may be saved once in the memory block 304. For example, a single-bit flag may classify the entire memory block 304 as hot or cold.

In one implementation, a write frequency classification is saved in association with some, but not all, of the data on the storage device 302. For example, a default step size can be used for un-flagged data, and another step size can be used for flagged data. In one implementation, a larger pulse step height is used as the default value.

In still another implementation, the write frequency of data is not classified when the data is initially written to the storage device 302. Rather, the write frequency classifier 308 classifies the write frequency of the data during a background data monitoring process of the storage device 302. For example, a storage device controller may use idle time to check (read) some information from the memory device 302, such as to check the write frequency of various data units (e.g., a page, multiple pages, data blocks, etc.) that are not yet classified as either "hot or cold." Based on the write frequency, the controller assigns a "hot" or "cold" classification to each of the data units.

In addition to the write frequency classifier 308, the controller 306 also includes a write frequency classification identifier 312. When data on the flash memory device 302 is moved from one location to another, the write frequency classification identifier 312 reads the write frequency classification associated with each page or data block to determine a pulse step height ($\Delta V$) for an ISPP operation of data in the page or block. For example, the controller 306 may decide to move data from a first data block to a second data block of the storage device 302 during a garbage collection or wear-leveling operation. By reading the write frequency classification that is saved in association with the data on the first data block, the write frequency classification identifier 312 determines how large or small of a pulse step height to be used in the ISPP operation of the second data block.

In one implementation, the write frequency classification identifier 312 reads a one-bit flag that indicates whether the data is classified as hot or cold. If the data is classified as 'hot', the controller 306 selects a larger pulse step height for the ISPP operation than if the data is classified as 'cold.' In another implementation, the write frequency classification identifier 312 reads a two-bit flag that indicates whether the data is "cold", "cool", "warm", or "hot." The controller 306 selects pulse step heights increasing in magnitude along with the ranking between "cold" and "hot." In still other implementations, the write frequency classification identifier 312 reads a flag greater than 2-bits to select an appropriate pulse step height.

Figure 4:
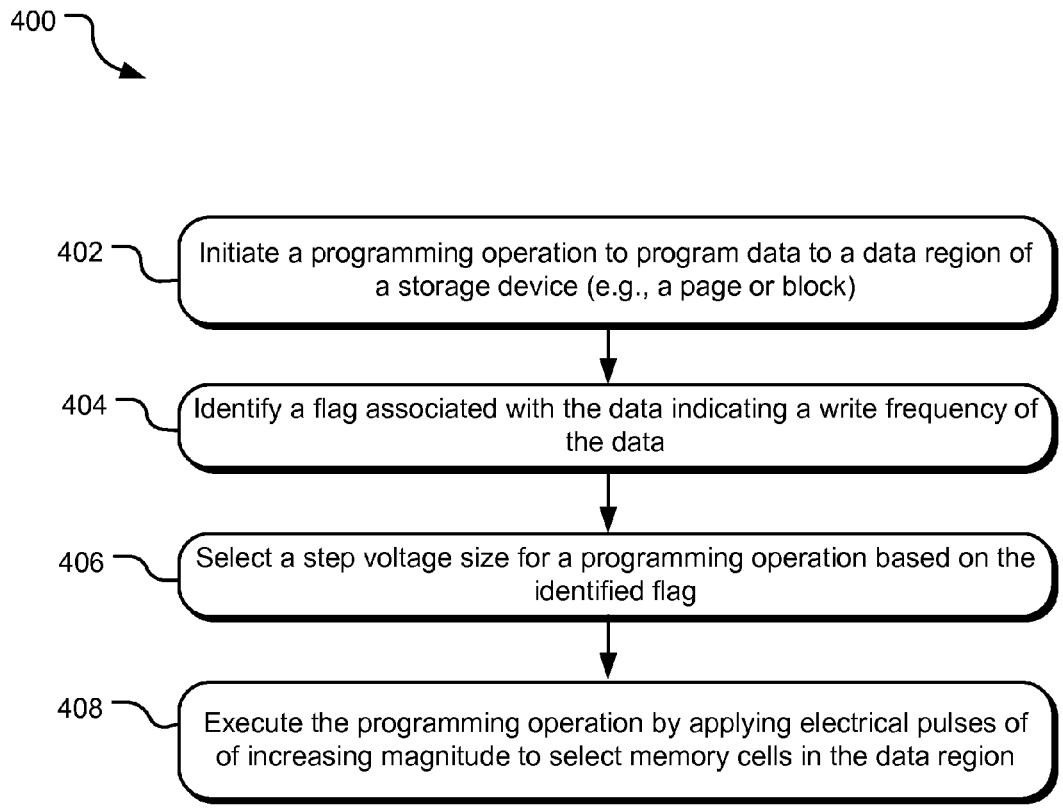
FIG. 4 illustrates an example flowchart of operations for performing a programming operation based on the write frequency of associated data.

FIG. 4 illustrates an example flowchart of operations 400 for performing a programming operation based on the write frequency of associated data. A programming initiation operation 402 initiates a programming operation to program data to a region of a storage device. For example, a controller of a storage device may initiate a garbage collection or wear-leveling operation. An identification operation 404 identifies a flag saved in association with the data that indicates a write frequency of the data. For example, the data affected by a garbage collection operation may include several pages within a data block. Each page of data may include a flag (e.g., a 1-bit flag) indicating whether the data of that page has been classified as 'hot' or 'cold.'

A selection operation 406 selects a pulse step height for an ISPP operation based on the flag. A smaller pulse step height is selected for data flagged as cold (or cool) than for data that is flagged as hot (or warm). An execution operation 408 executes the ISPP operation by applying pulses of increasing magnitude to the control gate of each of a number of select memory cells in the data region. Each pulse of increasing magnitude is increased by the pulse step height relative to the previous pulse. Between each pulse of increasing magnitude, a program verify operation is performed to check whether each of the selected memory cell has a threshold voltage that has risen above a program verify voltage level for that memory cell. The ISPP operation continues until a threshold voltage of each of the selected memory cells rises above a corresponding program verify voltage so that the threshold voltage of each of the cells represents a desired memory state.

The implementations of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. Apparatus comprising:
a storage controller configured to select a pulse step height for an incremental step pulse programming (ISPP) operation of one or more memory cells of a storage device based on a classification assigned to data programmed via the ISPP operation, the classification designating a write frequency of the data and determined based on an identifier saved in association with the data on the storage device that identifies the data as hot or cold and the storage controller is further configured to apply a series of electrical pulses to the one or more memory cells, each subsequent electrical pulse increasing in magnitude by the selected pulse step height,
wherein the storage controller selects a first pulse step height responsive to a determination that the write frequency of the data exceeds a threshold frequency and selects a second pulse step height smaller than the first pulse height responsive to a determination that the write frequency of the data does not exceed the threshold frequency.

2. The apparatus of claim 1, wherein the storage controller applies the series of electrical pulses to a control gate of the one or more memory cells.

3. The apparatus of claim 1, wherein the identifier is received from the host in association with the data and is saved in association with the data on the storage device.

4. The apparatus of claim 3, where the storage controller is further configured to program the identifier in at least one of a same page and a same data block that includes the data after the programming operation.

5. The apparatus of claim 3, wherein the identifier is a one-bit value.

6. The apparatus of claim 3, wherein the identifier is a two-bit value.

7. The apparatus of claim 3, wherein the controller assigns the identifier to the data when the data is originally programmed to the storage device.

8. The apparatus of claim 1, wherein the storage controller is further configured to select the pulse step height by reading an identifier saved in at least one of a same page and a same data block as the data.

9. One or more non-transitory computer-readable storage media encoding computer-executable instructions for executing on a computer system a computer process, wherein the computer-readable media is not a carrier wave or propagating signal and the computer process comprises:
selecting a pulse step height for an ISPP operation of one or more memory cells of a storage device based on a classification assigned to data programmed via the ISPP operation, the classification designating a write frequency of the data and determined based on an identifier saved in association with the data on the storage device that identifies the data as hot or cold, wherein a first pulse step height is selected responsive to a determination that the write frequency of the data exceeds a threshold frequency and a second pulse step height smaller than the first pulse height is selected responsive to a determination that the write frequency of the data does not exceed the threshold frequency; and
applying a series of electrical pulses to the one or more memory cells, each subsequent pulse increasing in magnitude by the selected pulse step height.

10. The one or more non-transitory computer-readable storage media of claim 9, wherein applying the series of electrical pulses further comprises:
   applying the series of electrical pulses to a control gate of the one or more memory cells.

11. The one or more non-transitory computer-readable storage media of claim 9, wherein selecting the pulse step height further comprises:
   reading the identifier saved in at least one of a same page and a same data block as the data.

12. The one or more non-transitory computer-readable storage media of claim 9, further comprising:
   programming the identifier in at least one of a same page and data block that includes the data after the programming operation.

13. The one or more non-transitory computer-readable storage media of claim 9, wherein the identifier is a one-bit value.

14. The one or more non-transitory computer-readable storage media of claim 9, wherein the identifier is assigned to the data when the data is originally programmed to the storage device.

15. The one or more non-transitory computer-readable storage media of claim 9, wherein the identifier is originally determined based on information received from the host in association with the data that indicates whether or not a particular programming operation is user-initiated.

* * * * *